(12) United States Patent
Ten Hoopen et al.

(10) Patent No.: US 11,835,106 B2
(45) Date of Patent: Dec. 5, 2023

(54) METHOD FOR MANUFACTURING DAMPER DEVICE, LITHOGRAPHIC APPARATUS, PROJECTION SYSTEM, AND DEVICE MANUFACTURING METHOD

(71) Applicant: ASML Netherlands B.V., Veldhoven (NL)

(72) Inventors: Derk Ten Hoopen, Zevenaar (NL); Francois-Xavier Debiesme, Eindhoven (NL); Eric Pierre-Yves Vennat, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 412 days.

(21) Appl. No.: 16/772,406

(22) PCT Filed: Nov. 15, 2018

(86) PCT No.: PCT/EP2018/081326
§ 371 (c)(1),
(2) Date: Jun. 12, 2020

(87) PCT Pub. No.: WO2019/115134
PCT Pub. Date: Jun. 20, 2019

(65) Prior Publication Data
US 2021/0079971 A1    Mar. 18, 2021

(30) Foreign Application Priority Data

Dec. 15, 2017    (EP) ..................................... 17207548

(51) Int. Cl.
*G03F 7/20*    (2006.01)
*F16F 9/30*    (2006.01)
(Continued)

(52) U.S. Cl.
CPC ............ *F16F 9/306* (2013.01); *F16F 9/3207* (2013.01); *G03F 7/70808* (2013.01)

(58) Field of Classification Search
CPC ..... F16F 9/306; F16F 9/3207; G03F 7/70808; G03F 7/709; G03F 7/70825
See application file for complete search history.

(56) References Cited

U.S. PATENT DOCUMENTS

| | | | |
|---|---|---|---|
| 4,899,323 A * | 2/1990 | Fukahori | E04B 1/36 248/560 |
| 5,279,900 A | 1/1994 | Takeuchi et al. | |

(Continued)

FOREIGN PATENT DOCUMENTS

| | | |
|---|---|---|
| EP | 0 493 123 A1 | 7/1992 |
| JP | S62-24050 A | 2/1987 |

(Continued)

OTHER PUBLICATIONS

International Search Report and Written Opinion of the International Searching Authority directed to related International Patent Application No. PCT/EP2018/081326, dated Feb. 26, 2019; 10 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

The invention relates a method for manufacturing a damper device including a first part and a second part, said method comprising the following steps: a) providing a damping material in a space in between the first part and the second part, such that the damping material is in a compressed state in the space; and b) heating the device to a predetermined temperature in order to adhere the damping material to the first part and the second part.

12 Claims, 5 Drawing Sheets

(51) Int. Cl.
*F16F 9/32* (2006.01)
*G03F 7/00* (2006.01)

(56) References Cited

U.S. PATENT DOCUMENTS

| | | | |
|---|---|---|---|
| 5,946,866 A | 9/1999 | Weglewski et al. | |
| 6,208,408 B1 | 3/2001 | Takabayashi | |
| 8,516,753 B2 | 8/2013 | Christopoulos et al. | |
| 8,625,070 B2 | 1/2014 | Farnsworth et al. | |
| 8,908,144 B2 | 12/2014 | Groeneveld et al. | |
| 2003/0155882 A1* | 8/2003 | Ono | G03F 7/709 |
| | | | 318/649 |
| 2007/0012535 A1* | 1/2007 | Matheny | F16F 9/306 |
| | | | 188/266 |
| 2008/0250746 A1 | 10/2008 | Nawrotski | |
| 2009/0145541 A1 | 6/2009 | Xiao | |
| 2010/0089712 A1* | 4/2010 | Butler | G03F 7/709 |
| | | | 355/53 |
| 2012/0138401 A1* | 6/2012 | Vogler | G03F 7/70825 |
| | | | 188/378 |

FOREIGN PATENT DOCUMENTS

| | | |
|---|---|---|
| JP | S63-184660 A | 7/1988 |
| JP | H 01-182644 A | 7/1989 |
| JP | H 06-040493 U | 5/1994 |
| JP | H 11-152932 A | 6/1999 |
| JP | H11-509608 A | 8/1999 |
| JP | 2000-110878 A | 4/2000 |
| JP | 2000-334621 A | 12/2000 |
| JP | 2001-288329 A | 10/2001 |
| JP | 2003-191253 A | 7/2003 |
| JP | 2006258156 A * | 9/2006 |
| JP | 2008-114501 A | 5/2008 |
| JP | 2008202658 A * | 9/2008 |
| JP | 2008-291926 A | 12/2008 |
| JP | 2009-513898 A | 4/2009 |
| JP | 2009-127709 A | 6/2009 |
| JP | 2010-505260 A | 2/2010 |
| JP | 2011-503887 A | 1/2011 |
| JP | 2011-149476 A | 8/2011 |
| JP | 2011-256577 A | 12/2011 |
| JP | 2013-108562 A | 6/2013 |
| JP | 2014-058790 A | 4/2014 |
| JP | 2015-224700 A | 12/2015 |
| WO | WO 2009/001807 | 8/2010 |
| WO | WO 2013/034753 A1 | 3/2013 |

OTHER PUBLICATIONS

International Preliminary Report on Patentability directed to related International Patent Application No. PCT/EP2018/081326, dated Jun. 16, 2020; 7 pages.

Research Disclosure, Kenneth Mason Publications, Hampshire, UK, GB, vol. 565, No. 59 May 1, 2011; 4 pages.

Japanese Notification of Reasons for Refusal directed to Japanese Patent Application No. 2022-040926, dated Jun. 6, 2023; 9 pages.

\* cited by examiner

METHOD FOR MANUFACTURING DAMPER DEVICE, LITHOGRAPHIC APPARATUS, PROJECTION SYSTEM, AND DEVICE MANUFACTURING METHOD

CROSS-REFERENCE TO RELATED APPLICATIONS

This application claims priority of EP application 17207548.3 which was filed on Dec. 15, 2017 and which is incorporated herein in its entirety by reference.

BACKGROUND

Field of the Invention

The present invention relates to a method for manufacturing a damper device, the use of such a damper device in a lithographic apparatus or projection system, and the use of such a lithographic apparatus in a device manufacturing method.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, damper devices are used to support and isolate elements, such as optical elements with respect to a frame. Currently, providing damping material to a damper device, especially a passive damper device requires complex manufacturing processes to ensure a reliable force transfer between damper device parts and damping material.

SUMMARY

It is desirable to provide an improved damper device, in particular a damper manufacturing process which is relatively easy and ensures a reliable force transfer between device parts and damping material.

According to an embodiment of the invention, there is provided a method for manufacturing a damper device including a first part and a second part, said method comprising the following steps:

a) providing a damping material in a space in between the first part and the second part, such that the damping material is in a compressed state in the space; and b) heating the device to a predetermined temperature in order to adhere the damping material to the first part and the second part.

According to another embodiment of the invention, there is provided a projection system configured to project a patterned radiation beam onto a target portion of a substrate, wherein the projection system comprises an optical element which is supported by one or more damper devices manufactured using a method according to the invention.

According to yet another embodiment of the invention, there is provided a lithographic apparatus comprising one or more damper devices manufactured using a method according to the invention.

According to a further embodiment of the invention, there is provided a device manufacturing method wherein use is made of a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
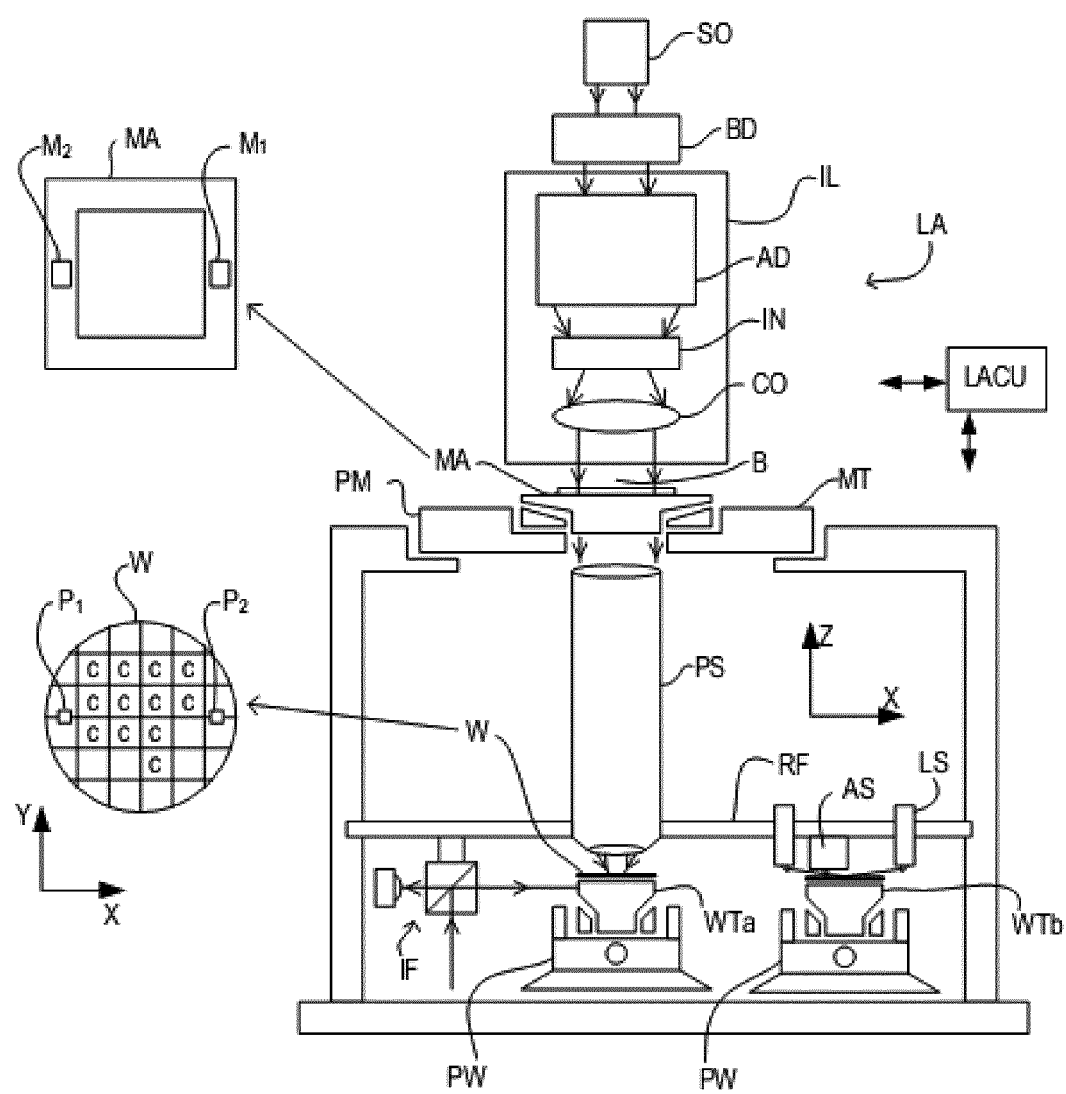
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "radiation" and "beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks M1, M2 may be located between the dies.

The depicted apparatus can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de)-magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
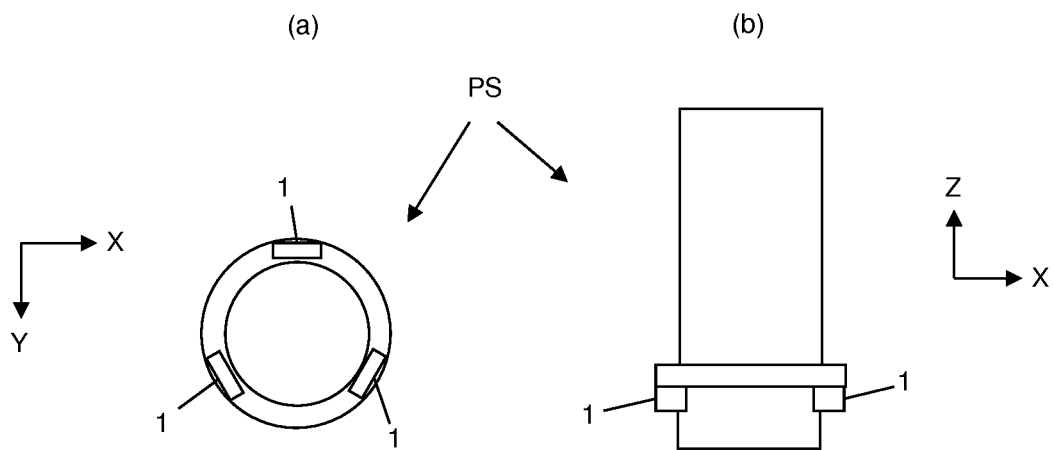
FIG. 2 schematically depicts a projection system according to an embodiment of the invention.

FIG. 2 schematically depicts the projection system PS of the lithographic apparatus of FIG. 1. The projection system PS is a projection system according to an embodiment of the invention as will be described below. In FIG. 2, two views of the projection system PS are shown, namely a view (a) and a view (b). View (a) is a bottom view and view (b) is a side view. Both views are accompanied by a coordinate system indicating the X, Y and Z direction similar to FIG. 1.

The projection system PS is supported from a frame RF (see FIG. 1), e.g. a base frame, metrology frame or any other frame, using three damper devices 1 according to an embodiment of the invention. It will be apparent to the skilled person that the use of any number of spring-damper devices 1 is envisaged and that the shown three damper devices 1 are a mere example.

As can be clearly seen in FIG. 2, the three damper devices 1 are distributed evenly along the circumference of the projection system PS. This allows to support the projection system PS in six degrees of freedom when each damper device 1 is able to support the projection system PS in at least two degrees of freedom.

Figure 3:
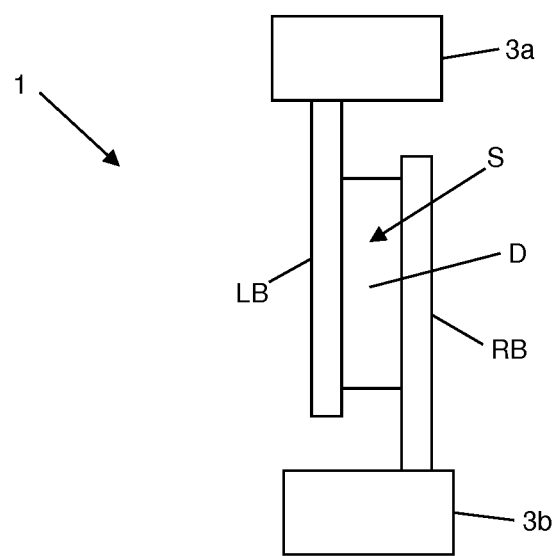
FIG. 3 schematically depicts a cross-sectional view of a damper device according to an embodiment of the invention.

FIG. 3 depicts a cross-sectional view of a damper device 1 according to an embodiment of the invention. The damper device 1 comprises a first part 3a and a second part 3b. The first part 3a may in this embodiment be a connecting portion to connect the damper device 1 to the projection system PS of FIGS. 1 and 2. The second part 3b may in this embodiment be a connecting portion to connect the damper device 1 to a frame, e.g. frame RF as shown in FIG. 1.

Connected to the first part 3a is a left blade LB and connected to the second part 3b is a right blade RB. The left blade LB and the right blade RB during assembly of the damper device 1 will be positioned relative to each other such that the left blade LB and the right blade RB delimit a space S at opposite sides thereof. The space S is filled with a damping material D. At first the damping material D may be in uncompressed state while being introduced into the space S. The damping material D may then be brought into a compressed state by moving the first 3a and second part 3b and thus the left blade LB and the right blade RB towards each other, thereby reducing the volume of the space S in between the left blade LB and the right blade RB to such an extent that the damping material D is brought into the compressed state.

In an embodiment, the damping material D is a viscoelastic material, preferably a thermoplastic elastomer.

The damping function of the damping material D is realized when movement between the first part 3a and the second part 3b causes the damping material D to deform which damping material D will dissipate the corresponding energy at least partially into heat. In an embodiment, the damper device 1 is arranged parallel to a spring device to cooperate with the spring device.

Figure 4:
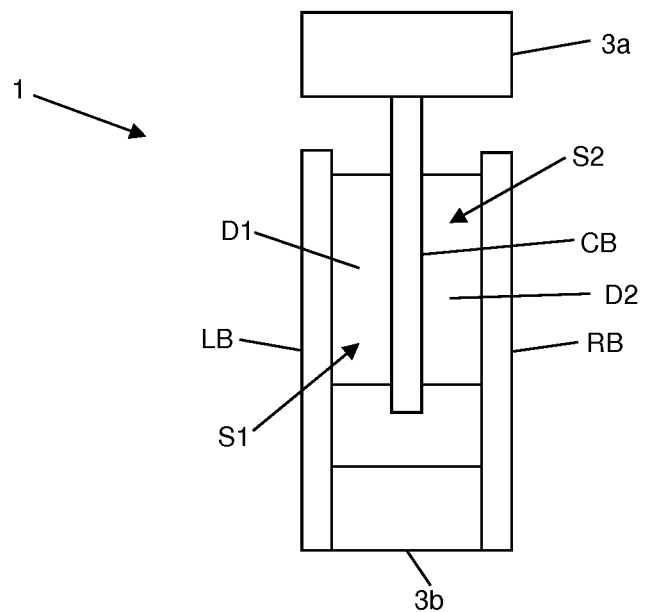
FIG. 4 schematically depicts a cross-sectional view of a damper device according to another embodiment of the invention.

FIG. 4 depicts a cross-sectional view of a damper device 1 according to another embodiment of the invention. The damper device 1 comprises a first part 3a and a second part 3b. The first part 3a may in this embodiment be a connecting portion to connect the damper device 1 to the projection system PS of FIGS. 1 and 2. The second part 3b may in this embodiment be a connecting portion to connect the damper device 1 to a frame, e.g. frame RF as shown in FIG. 1.

Connected to the first part 3a is a center blade CB and connected to the second part 3b is a left blade LB and a right blade RB. The left blade LB and the center blade CB delimit a first space S1 at opposite sides thereof. The center blade CB and the right blade RB delimit a second space S2 at opposite sides thereof. The spaces S1, S2 are filled with a damping material D1, D2, respectively. At first the damping materials D1, D2 may be in uncompressed state while being introduced into the spaces S1, S2, respectively. The damping materials D1, D2 may then be brought into a compressed state by moving the left blade LB and the right blade RB towards the center blade, e.g. by clamping the left blade LB and the right blade RB to the second part 3b, thereby reducing the volume of the spaces S1, S2 to such an extent that the damping materials D1, D2 are brought into the compressed state.

In an embodiment, the damping material D1, D2 is a viscoelastic material, preferably a thermoplastic elastomer.

The damping function of the damping material D1, D2 is realized when movement between the first part 3a and the second part 3b causes the damping material D1, D2 to deform which damping material D1, D2 will dissipate the corresponding energy at least partially into heat. In an embodiment, the damper device 1 is arranged parallel to a spring device to cooperate with the spring device.

Figure 5:
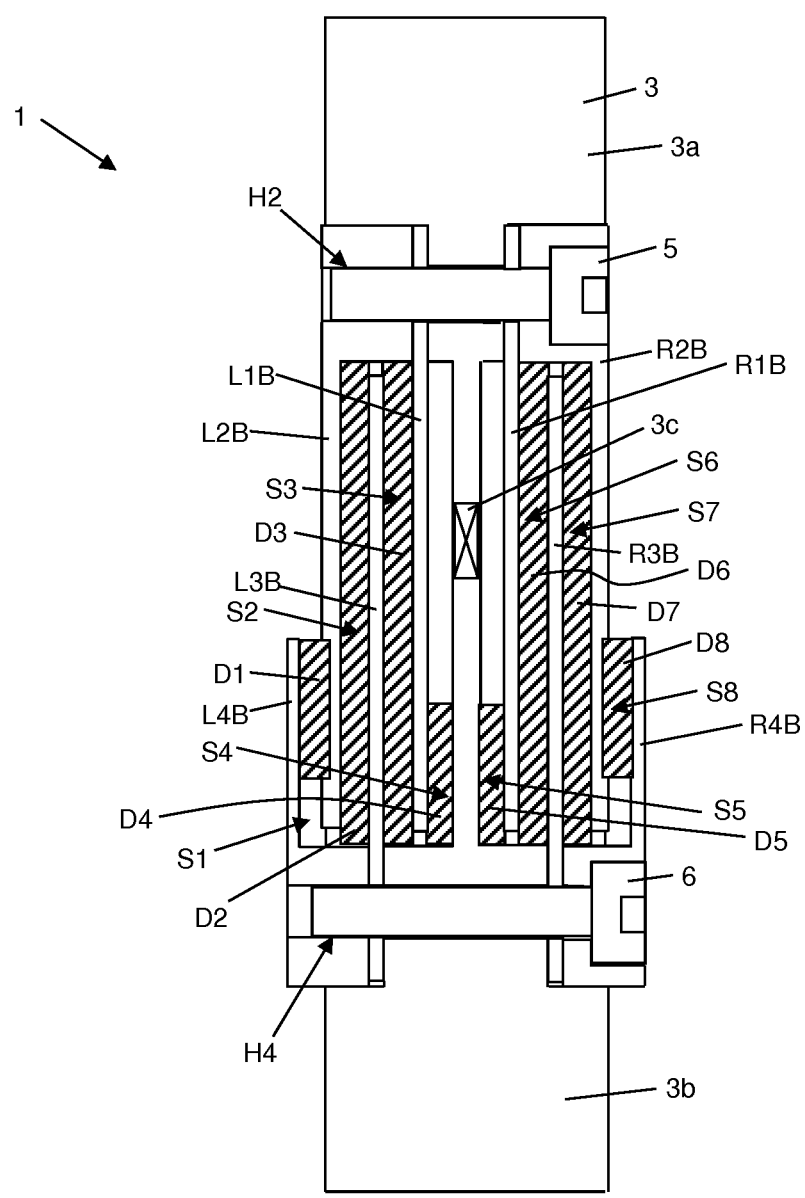
FIG. 5 schematically depicts a cross-sectional view of a spring-damper device according to yet another embodiment of the invention.

FIG. 5 depicts a cross-sectional view of a damper device 1 according to yet another embodiment of the invention. The damper device 1 is in this embodiment a spring-damper device 1 comprising a spring 3 with a connecting portion 3a to connect the spring-damper device 1 to the projection system PS, a connecting portion 3b to connect the spring-damper device 1 to a frame, e.g. frame RF as shown in FIG. 1, and a spring portion 3c connecting the connecting portion 3a to the connecting portion 3b, which spring portion 3c is elastic and is able to store mechanical energy upon deflection. The spring portion 3c thus urges the connecting portion 3a and the connecting portion 3b to an equilibrium position relative to each other.

The spring 3 further comprises a left first blade L1B, a right first blade R1B, a left second blade L2B and a right second blade R2B. The spring also comprises a left third blade L3B, a right third blade R3B, a left fourth blade L4B and a right fourth blade R4B.

The left and right first blades L1B, R1B and the left and right second blades L2B, R2B are connected to the connecting portion 3a via one or more bolts 5 which mate with corresponding one or more threaded holes H2 in the left second blade L2B allowing to clamp said blades and the connecting portion 3a together to form a first part of the spring 3.

The left and right third blades L3B, R3B and the left and right fourth blades L4B, R4B are connected to the connecting portion 3b via one or more bolts 6 which mate with corresponding one or more threaded holes H4 in the left fourth blade L4B allowing to clamp said blades and the connecting portion 3b together to form a second part of the spring 3.

The arrangement of the blades and the spring is such that in the cross section of FIG. 5, when traveling from left to right, one encounters the following elements and spaces in the following order:
1) the left fourth blade L4B;
2) a first space S1 delimited on one side by the left fourth blade L4B and on an opposite side by the left second blade L2B;
3) the left second blade L2B;
4) a second space S2 delimited on one side by the left second blade L2B and on an opposite side by the left third blade L3B;
5) the left third blade L3B;
6) a third space S3 delimited on one side by the left third blade L3B and on an opposite side by the left first blade L1B;
7) the left first blade L1B;
8) a fourth space S4 delimited on one side by the left first blade L1B and on an opposite side by the connecting portion 3b;
9) the connecting portion 3b;
10) a fifth space S5 delimited on one side by the connecting portion 3b and on an opposite side by the right first blade R1B;
11) the right first blade R1B;
12) a sixth space S6 delimited on one side by the right first blade R1B and on an opposite side by the right third blade R3B;
13) the right third blade R3B;
14) a seventh space S7 delimited on one side by the right third blade R3B and on an opposite side by the right second blade R2B;
15) the right second blade R2B;
16) an eight space S8 delimited on one side by the right second blade R2B and on an opposite side by the right fourth blade R4B; and
17) the right fourth blade R4B.

The spaces S1 to S8 are each filled with a corresponding damping material D1 to D8. At first the damping material D1 to D8 may be in an uncompressed state while being introduced into the spaces S1 to S8. The volume of the damping material D1 to D8 is chosen such that when the blades are clamped to the corresponding connecting portion by the respective bolts 5 and 6, the volume of the spaces S1 to S8 are reduced to such an extent that the damping material D1 to D8 is brought into a compressed state.

In an embodiment, the damping material D1 to D8 is a viscoelastic material, preferably a thermoplastic elastomer.

An advantage of the blades being detachably mounted to a connecting portion of the spring is that it is relatively easy to introduce the damping material D1 to D8 in the corresponding space S1 to S8, but additionally, after having introduced the damping material D1 to D8 in the corresponding spaces S1 to S8, it is much easier to correct any misplacement of the damping material by disassembling the blades and giving it another try.

Although the described embodiment makes use of a reduction in volume of the spaces S1 to S8 during assembly to bring the damping material D1 to D8 in a compressed state, it is also possible that the volume of the damping material D1 to D8 initially matches the volume of the spaces S1 to S8, but subsequently the damping material D1 to D8 is brought into a compressed state by expansion of the damping material D1 to D8. This can for instance be done by lowering the temperature of the damping material D1 to D8 such that the volume of the damping material D1 to D8 matches or is smaller than the volume of the spaces S1 to S8 and after introducing the damping material D1 to D8 into said spaces let the damping material return to room temperature thereby urging the damping material D1 to D8 to expand, which results in the damping material D1 to D8 being in a compressed state.

Another possibility is that the damping material D1 to D8 is introduced into the respective spaces S1 to S8 in a compressed state, e.g. when the blades are clamped first to the corresponding connecting portions and subsequently the damping material D1 to D8 is introduced in the spaces S1 to S8.

The damping function of the damping material D1 to D8 is realized when relative movement between the connecting portions 3a, 3b causes the damping material D1 to D8 to deform which damping material D1 to D8 will dissipate the corresponding energy at least partially into heat. For the embodiment of FIG. 5, this means that the blades need to be rigidly connected to the respective connecting portions, and further that the damping material D1 to D8 is connected to the corresponding blades or other parts of the spring delimiting the space the damping material is in.

Figure 6:
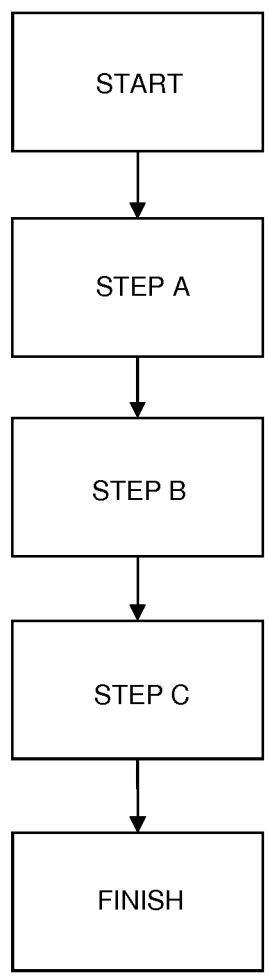
FIG. 6 schematically depicts a block scheme of a fabrication method according to an embodiment of the invention.

FIG. 6 depicts a block scheme of a method for manufacturing a damper device, e.g. a damper device 1 according to the embodiments of FIGS. 3-5, for application in a lithographic apparatus of FIG. 1, for instance by supporting a projection system as depicted in FIGS. 1 and 2. The device 1 includes a first part and a second part, which are moveable relative to each other in some embodiments due to the presence of a spring configured to act between the first part and the second part. Such a method includes a first step A in which a damping material is provided in a space in between the first part and the second part, such that the damping material is in a compressed state in the space.

Subsequently, in step B, the device is heated to a predetermined temperature in order to adhere the damping material to the first part and the second part. Adherence may for instance be realized by lowering the Young's Modulus of the damping material to better accommodate the surface of the first and second parts, i.e. increase contact surface between damping material and the first and second parts.

The predetermined temperature is preferably below the melting temperature of the damping material, but high enough to let the damping material adjust itself to the surface of the first and second parts of the spring. Preferably, the predetermined temperature of the device is maintained for a predetermined period of time.

After being heated to the predetermined temperature, the device is allowed to cool to obtain a temperature equal to room temperature in step C. The cooling may be passive by simply removing the heat source, but the cooling may also be active, e.g. by subjecting the device to an air flow having a temperature at room temperature or lower.

The method is preferably such that after step C, the damping material in between the first and second parts of the spring is still in a compressed state. This is easily possible for the embodiments of FIGS. 4 and 5 using the described elements. However, for the embodiment of FIG. 3 an additional element, e.g. a spring element, may be needed to urge the first and second parts 3a, 3b towards each other.

Although the described embodiments refer to heating the device to a predetermined temperature, it is explicitly noted here that in some embodiments, depending on the damping material used, the heating of the device may be omitted or the predetermined temperature is close to ambient temperature. In an embodiment, the predetermined temperature is 20 degrees or higher, preferably 25 degrees or higher, more preferably 35 degrees or higher and most preferably 45 degrees or higher. In an embodiment, the predetermined temperature is 100 degrees or lower, preferably 80 degrees or lower, more preferably 60 degrees or lower and most preferably 55 degrees or lower. Mentioned temperatures are in degrees Celsius. Heating the device may have the advantage of speeding up the process of adhering the damping material to the first part and the second part under compression. Omitting the heating is thus only beneficial if there is sufficient time for said process.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for manufacturing a damper device including a first part and a second part, wherein the first part and second part each contain blade portions that extend toward each other and form a space, said method comprising the following steps:

providing a compressed damping material in the space between the blade portions of the first and second parts, or compressing a damping material in the space between the blade portions of the first and second parts; and heating the damper device to a predetermined temperature to adhere the damping material to the first part and the second part, wherein the first part of the damper device is disposed at a first end of the damper device and is configured to connect to a first device and the second part of the damper device is disposed at a second end of the damper device and is configured to connect to a second device such that the damper device provides damping between the first and second devices.

2. The method of claim 1, wherein the damper device further comprises a spring configured to act between the first part and the second part.

3. The method of claim 1, wherein the damping material is a viscoelastic material comprising a thermoplastic elastomer.

4. The method of claim 1, wherein the heating is carried out such that after the heating the damping material in between the first and second parts remains in the compressed state.

5. The method of claim 1, wherein the first part and the second part provide a plurality of spaces delimited on one side by the first part and on an opposite side by the second part, and wherein each of the plurality of spaces is provided with damping material such that the damping material is in the compressed state in each of the plurality of spaces.

6. The method of claim 1, wherein the first part has two degrees of freedom relative to the second part and the damping material is configured to provide damping in both degrees of freedom.

7. The method of claim 1, wherein during the heating of the device, the device is maintained at the predetermined temperature for a predetermined period of time.

8. The method of claim 1, wherein during the providing of the damping material, the damping material is introduced into the space in an uncompressed state and subsequently brought into the compressed state by reducing a volume of the space.

9. The method of claim 1, wherein during the providing the damping material, the damping material is introduced into the space in an uncompressed state and subsequently brought into the compressed state by expansion of the damping material.

10. The method of claim 1, wherein at least a portion of a device delimiting the space is detachably mounted to the device.

11. A lithographic apparatus comprising a damper device manufactured using the method of claim 1.

12. A device manufacturing method wherein use is made of the lithographic apparatus of claim 11.

* * * * *